(12) United States Patent
Nakao et al.

(10) Patent No.: US 9,392,701 B2
(45) Date of Patent: Jul. 12, 2016

(54) ELECTRONIC COMPONENT PACKAGE

(71) Applicant: SAE Magnetics (H.K.) Ltd., Hong Kong (CN)

(72) Inventors: Akio Nakao, Hong Kong (CN); Hidenobu Takemoto, Hong Kong (CN)

(73) Assignee: SAE MAGNETICS (H.K.) LTD., Hong Kong (CN)

( * ) Notice: Subject to any disclaimer, the term of this patent is extended or adjusted under 35 U.S.C. 154(b) by 169 days.

(21) Appl. No.: 14/289,932

(22) Filed: May 29, 2014

(65) Prior Publication Data

US 2015/0124417 A1    May 7, 2015

(30) Foreign Application Priority Data

Nov. 7, 2013   (CN) .................. 2013 2 0700804 U

(51) Int. Cl.
| | |
|---|---|
| *H05K 1/18* | (2006.01) |
| *H05K 3/28* | (2006.01) |
| *H05K 9/00* | (2006.01) |
| *H05K 1/02* | (2006.01) |

(52) U.S. Cl.
CPC .............. *H05K 3/284* (2013.01); *H05K 9/0024* (2013.01); *H05K 9/0045* (2013.01); *H05K 1/0216* (2013.01); *H05K 2201/0209* (2013.01); *H05K 2201/0242* (2013.01); *H05K 2201/2072* (2013.01)

(58) Field of Classification Search
CPC .......... H05K 1/185; H05K 2201/0507; H05K 2201/10977
See application file for complete search history.

(56) References Cited

U.S. PATENT DOCUMENTS

| | | | | |
|---|---|---|---|---|
| 6,607,825 | B1 * | 8/2003 | Wang | B32B 7/12 174/259 |
| 9,293,421 | B2 * | 3/2016 | Yanagida | H01L 23/552 |
| 2009/0104429 | A1 * | 4/2009 | Goto | B32B 27/06 428/319.3 |
| 2010/0273014 | A1 * | 10/2010 | Ueki | H05K 3/181 428/457 |
| 2010/0304065 | A1 * | 12/2010 | Tomantschger | B32B 15/08 428/35.8 |
| 2010/0304171 | A1 * | 12/2010 | Tomantschger | C08J 7/123 428/548 |
| 2010/0323174 | A1 * | 12/2010 | Nagasaki | B05D 5/067 428/209 |
| 2011/0189432 | A1 * | 8/2011 | Goto | B32B 15/08 428/145 |
| 2011/0244183 | A1 * | 10/2011 | Goto | B32B 15/08 428/141 |
| 2012/0187585 | A1 | 7/2012 | Yamazaki | |
| 2015/0156864 | A1 * | 6/2015 | Kobayashi | H05K 1/0218 361/783 |

FOREIGN PATENT DOCUMENTS

| | | | |
|---|---|---|---|
| JP | 2005109306 A | * | 4/2005 |
| JP | 2012-151326 | | 8/2012 |

\* cited by examiner

*Primary Examiner* — Jeremy C Norris
*Assistant Examiner* — Nathan Milakovich
(74) *Attorney, Agent, or Firm* — Nixon & Vanderhye PC

(57) ABSTRACT

An electronic component package includes a substrate having at least one electronic circuit; a sealing resin for sealing the electronic circuit, at least one filler on which at least one crack is formed being filled in the sealing; and a metal film formed on a top surface of the sealing resin, a root of the metal film being embedded in the crack on the filler. The electronic component package can shield the environmental electromagnetic noise and satisfy with lightweight requirement for the integrated circuit modules.

7 Claims, 4 Drawing Sheets

ELECTRONIC COMPONENT PACKAGE

RELATED APPLICATIONS

This application claims the benefit of priority to Chinese Patent Application No. 201320700804.3, filed on Nov. 7, 2013, which is hereby incorporated by reference in its entirety.

FIELD OF THE INVENTION

The present invention relates to an integrated circuit field, and more particularly to an electronic component package with integrated circuits.

BACKGROUND OF THE INVENTION

As integrated circuits development increasingly, functions of the integrated circuits become more and more complex, and elements mounted on the electronic module are increased significantly. Meanwhile, requirement of size for the integrated electronic module becomes much strict, and compact and lightweight integrated circuit products have been a trend. Nowadays, influence of environmental electromagnetic noise on the compact and light integrated circuit products has been considered in the industry.

To prevent the electronic components integrated on the electronic module from being affected by the environmental magnetic noise, in some electronic module, a metal block or metal shell is covered on the electronic component. For example, after the electronic components are mounted on the circuit board and during the encapsulation process, a metal block or metal shell is covered on the surface of the electronic component. However, such a configuration of the metal block or metal shell is quite rough, and the bulk is large, which increases the thickness of the product consequentially, thereby departing from the lightweight requirement for the products.

Accordingly, it is desired to provide an improved and lightweight electronic component package, so as to shield the environmental electromagnetic noise to overcome the above-mentioned drawbacks.

SUMMARY OF THE INVENTION

One objective of the present invention is to provide an electronic component package which shields the environmental electromagnetic noise and satisfies with lightweight requirement for the integrated circuit modules.

To achieve above objective, an electronic component package includes a substrate having at least one electronic circuit; a sealing resin for sealing the electronic circuit, at least one filler on which at least one crack is formed being filled in the sealing; and a metal film formed on a top surface of the sealing resin, a root of the metal film being embedded in the crack on the filler.

Preferably, the crack has a flat opening.

As a preferred embodiment, it further includes an anti-oxidation film formed on the metal film.

Preferably, the top surface of the metal film is flat.

Preferably, the filler is made by silicon dioxide, and the filler has a diameter of 1 μm~30 μm.

Preferably, the metal film is made by copper, and the metal film has a thickness of 0.75 μm~5 μm; the anti-oxidation film is made by nickel, and the anti-oxidation film has a thickness larger than 0.5 μm.

Preferably, the root of the metal film is embedded into an interspace between the sealing resin and the filler.

In comparison with the prior art, since the electronic component package of the present invention has a metal film formed on the top surface of the sealing resin, and the root of the metal film is embedded in the crack on the filler of the sealing resin, thus the anchoring effect between the metal film and the sealing resin is improved, which is hard to flaked away from the sealing resin. Moreover, due to the metal film is formed on the top surface of the sealing resin in such a way, but not adding a metal block, thus such configuration of the electronic component package not only shields the environmental electromagnetic noise, but also satisfies with lightweight requirement for the integrated circuit modules.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
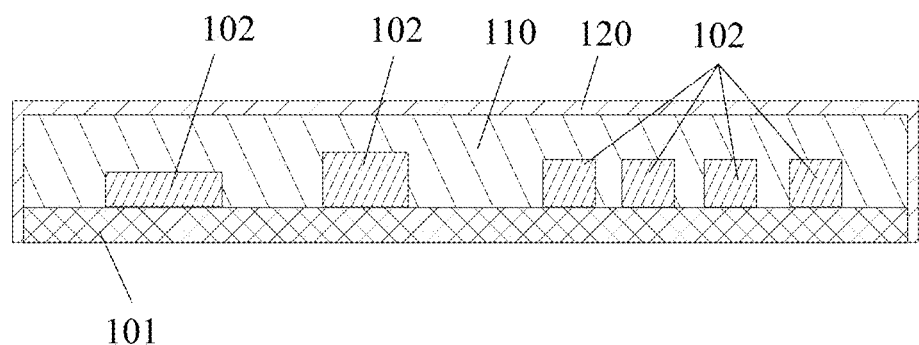
FIG. 1 is a sectional view of an electronic component package according to one embodiment of the present invention.
Figure 2:
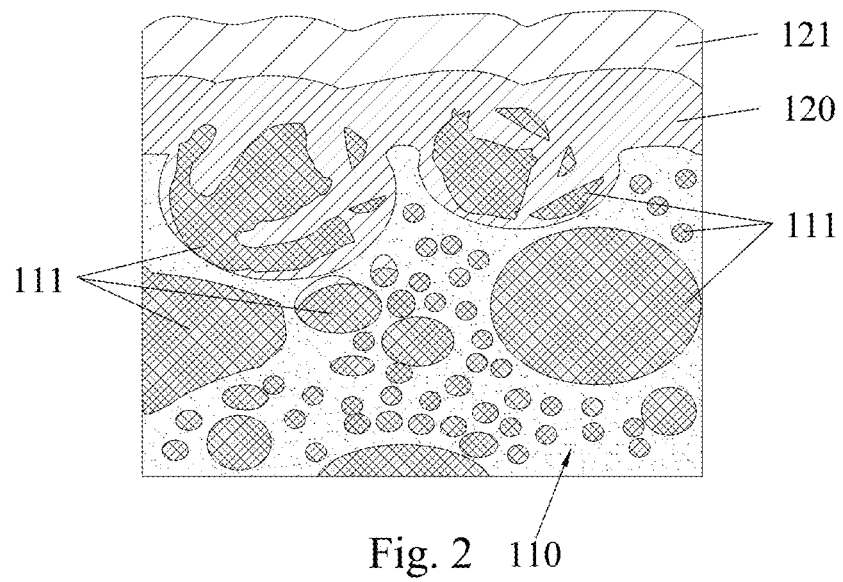
FIG. 2 is a partial enlarged view of the electronic component package of FIG. 1.
Figure 3:
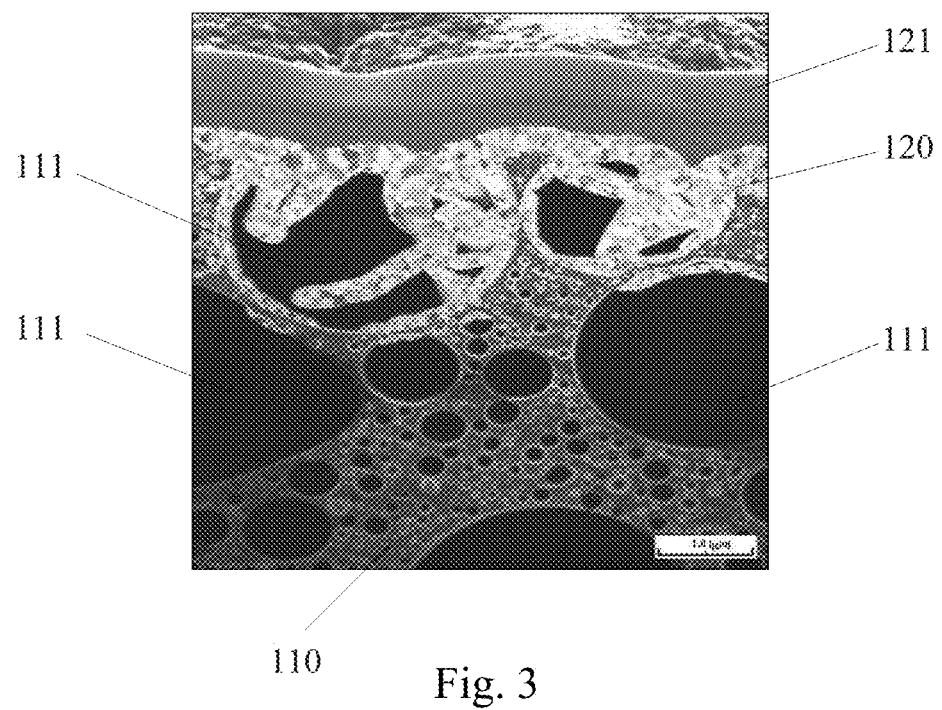
FIG. 3 is an enlarged image for FIG. 2.
Figure 4:
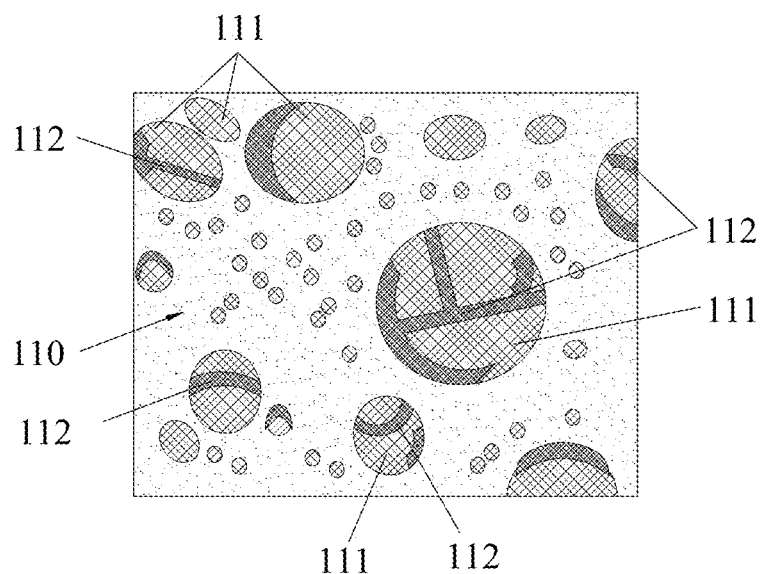
FIG. 4 is a top sectional view of the electronic component package with the metal film removed.
Figure 5:
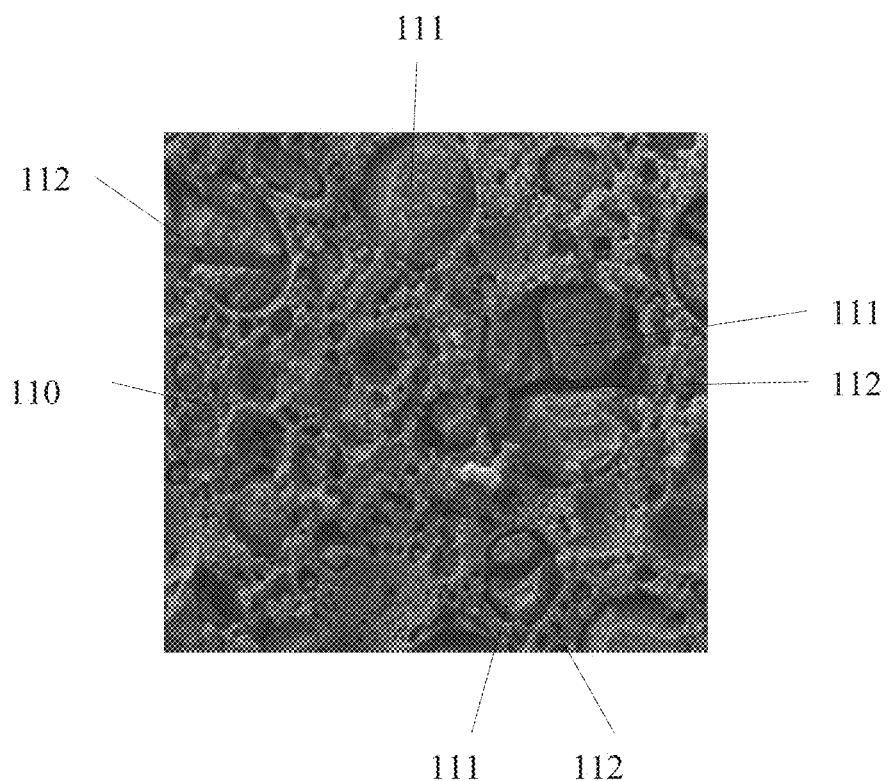
FIG. 5 is an enlarged image for FIG. 4.
Figure 6:
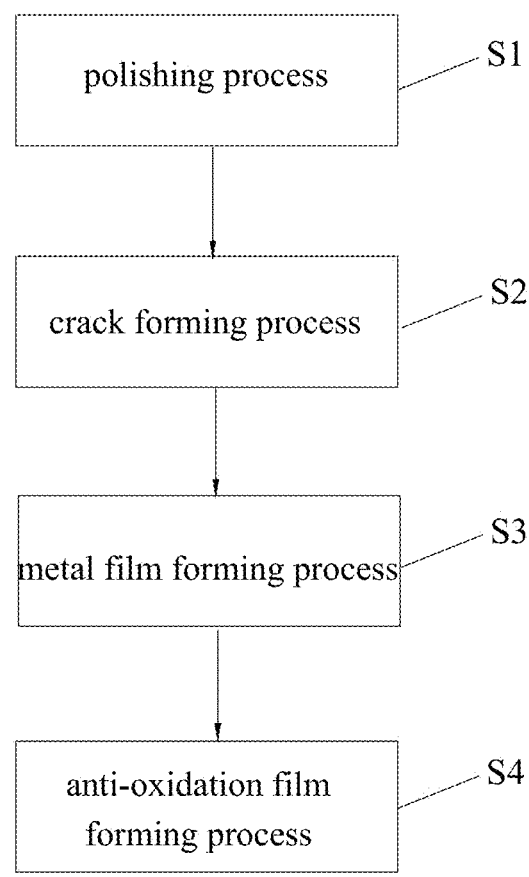
FIG. 6 is a simplified flowchart of manufacturing the electronic component package of the present invention.

Various preferred embodiments of the invention will now be described with reference to the figures, wherein like reference numerals designate similar parts throughout the various views. As indicated above, the invention is directed to an electronic component package which not only shields the environmental electromagnetic noise, but also satisfies with lightweight requirement for the integrated circuit modules. The electronic component package is applicable to any integrated circuit modules or products, which is not limited here.

Referring to FIG. 1, an electronic component package according to one embodiment of the present invention includes a substrate 101, multiple electronic components 102 formed on the substrate 101, a sealing resin 110 for sealing the electronic components 102, and a metal film 120 formed on the sealing resin 110.

Concretely, the substrate 101 can be a printed circuit board (PCB). The electronic components 102 can be integrated circuit chips, active electronic components, which are mounted on the substrate 101 by using conventional methods.

The sealing resin 110 is arranged for sealing the electronic components. As shown in FIGS. 2-5, the sealing resin 110 has several fillers 111 made by silicon dioxide ($SiO_2$) filled therein. These fillers 111 having different sizes are filled in the sealing resin 110, instead of exposed out of the outer surface of the sealing resin 110. Preferably, the diameter of the fillers 111 is between 1 μm to 30 μm, and between 2 μm to 20 μm more preferably. Multiple cracks 112 are formed on the filler 111, preferably formed by striking or etching the surface of the filler 111. Due to the particularity of the forming ways, the cracks 112 form a flat opening which will describe in detail. It should be noted that, material of the fillers 111 are not limited to SiO$_2$, other hard material suitable for striking or etching to form the cracks 112 also can be used.

Specifically, the metal film 120 serving as a shield for reducing environmental electromagnetic noise is formed on the top surface of the sealing resin 110, and the root of the metal film 120 is embedded in the cracks 112 of the fillers 111, that is, the root of the metal film 120 is infiltrated into the cracks 112, so that the metal film 120 is deeply rooted in the fillers 111. Preferably, a part of the root of the metal film 120 is embedded in the interspace between the sealing resin 120 and the fillers 111, so that the metal film 120 connects with the sealing resin 110 and the fillers 111 firmly. Preferably, the metal film 120 is further covered on side surfaces of the substrate 101, so as to cover both the top surface and the side surface of the sealing resin 110. The metal film 120 can use various kinds of metal material, such as copper (Cu) with smaller resistance and lower cost preferably. In the embodiments, for preventing the metal film 120 from being oxidized, an anti-oxidation film 121 is coated on the top surface of the metal film 121, for example, the anti-oxidation film 121 is made by nickel (Ni).

Preferably, the metal film 120 has a thickness of 0.75 µm~5 µm, so as to keep a good electromagnetic noise shielding effect and a good anchoring effect. More preferably, the thickness of the metal film 120 is between 1 µm~4 µm. And the thickness of the anti-oxidation film 121 is larger than 0.5 µm to achieve a good anti-oxidation effect.

Preferably, the top surfaces of the metal film 120 and the anti-oxidation film 121 are continuously flat, but not waved. Such configuration helps to connect the metal film 120 and the anti-oxidation film 121 with the sealing resin 110 and the fillers 111, thereby making them hard to flake away.

Combining with FIGS. 2-6, forming methods of the metal film 120 and the anti-oxidation film 121 are described as following.

S1, polishing process. Firstly, the surface of the sealing resin 110 sealing the electronic components is polished, so as to remove a thin layer of sealing resin 110, thereby exposing a part of the fillers 111. Such polishing/removal method can be lapping, striking, and the like, which are applicable to polish the top and side surfaces of the sealing resin 110.

S2, crack forming process. Secondly, cracks on the fillers 111 that are exposed outwards are formed by hitting or striking for example. Concretely, an opening is formed on the surface of the filler 111, and then the opening of the crack 112 is expanded and or enlarged in width or depth, so that the desired size for the crack 112 is obtained.

S3, metal film forming process. Concretely, a metal film 120 is plated on the surfaces (top and side surface) of the sealing resin 110 on which the cracks 112 are exposed, by using electroless plating process, so that a part of the metal material (such as Cu) is infiltrated into the cracks 112 to improve the anchoring effect of the fillers 111. Furthermore, the metal material is also infiltrated into the interspace between the filler and the sealing resin 110, so that the anchoring effect between the metal material, the filler 111 and the sealing resin 110 is excellent. Additionally, the top surface of the metal film 120 is controlled to be flat during plating.

S4, anti-oxidation film forming process. Concretely, an anti-oxidation film 121 (Ni film) is plated on the surface of the metal film 120 by using electroless plating process, at the same time, the surface of the Ni film 121 is controlled to be flat preferably.

Thus the process of forming the metal film 120 and the anti-oxidation film 121 is completed.

In comparison with the prior art, since the electronic component package 100 of the present invention has the metal film 120 formed on the top surface of the sealing resin 110, and the root of the metal film 120 is embedded in or infiltrated into the crack 112 on the filler 111 of the sealing resin 110, thus the anchoring effect between the metal film 120 and the sealing resin 110 is improved, which is hard to flaked away. Moreover, due to the metal film 120 is formed on the top surface of the sealing resin 110 in such a way, but not adding a metal block, thus such configuration of the electronic component package 100 not only shields the environmental electromagnetic noise, but also satisfies with lightweight requirement for the integrated circuit modules.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:
1. An electronic component package, comprising:
 a substrate having at least one electronic circuit;
 a sealing resin for sealing the electronic circuit, at least one filler being filled in the sealing resin;
 at least one crack formed in the at least one filler by hitting or striking the filler; and
 a metal film formed on a top surface of the sealing resin, a root of the metal film being embedded in the crack of the filler.
2. The electronic component package according to claim 1, wherein the crack has a flat opening.
3. The electronic component package according to claim 1, further comprising an anti-oxidation film formed on the metal film.
4. The electronic component package according to claim 1, wherein the top surface of the metal film is flat.
5. The electronic component package according to claim 1, wherein the filler is made by silicon dioxide, and the filler has a diameter of 1 µm~30 µm.
6. The electronic component package according to claim 3, wherein the metal film is made by copper, and the metal film has a thickness of 0.75 µm~5 µm; the anti-oxidation film is made by nickel, and the anti-oxidation film has a thickness larger than 0.5 µm.
7. The electronic component package according to claim 1, wherein the root of the metal film is embedded into an interspace between the sealing resin and the filler.

* * * * *